(12) United States Patent
Schoellkopf et al.

(10) Patent No.: US 6,473,725 B1
(45) Date of Patent: Oct. 29, 2002

(54) METHOD OF ACCURATE SIMULATION OF LOGIC CIRCUITS

(75) Inventors: Jean-Pierre Schoellkopf, Grenoble; Stéphane Hanriat, Saint Vincent de Mercuze, both of (FR)

(73) Assignee: SGS-Thomas Microelectronis S.A., Gentilly (FR)

( * ) Notice: Subject to any disclaimer, the term of this patent is extended or adjusted under 35 U.S.C. 154(b) by 0 days.

(21) Appl. No.: 09/022,570

(22) Filed: Feb. 12, 1998

(30) Foreign Application Priority Data

Feb. 14, 1997 (FR) .............................. 97 01969

(51) Int. Cl.[7] .......................... G06F 9/455; G06F 17/50
(52) U.S. Cl. .............................. 703/15; 703/18; 716/2; 716/6
(58) Field of Search ............................ 703/13, 17, 19, 703/14, 15, 18; 716/2, 6

(56) References Cited

U.S. PATENT DOCUMENTS

| | | | | |
|---|---|---|---|---|
| 4,527,249 A | * | 7/1985 | Van Brunt | 364/578 |
| 4,787,062 A | * | 11/1988 | Nei et al. | 364/900 |
| 5,091,872 A | * | 2/1992 | Agrawal | 364/578 |
| 5,384,720 A | * | 1/1995 | Ku et al. | 364/578 |
| 5,392,227 A | * | 2/1995 | Hiserote | 364/578 |
| 5,548,526 A | | 8/1996 | Misheloff | 364/491 |
| 5,550,760 A | * | 8/1996 | Razdan et al. | 395/578 |
| 5,559,715 A | | 9/1996 | Misheloff | 364/488 |
| 5,706,476 A | * | 1/1998 | Giramma | 364/500 |
| 5,850,355 A | * | 12/1998 | Molnar | 364/578 |
| 6,067,652 A | * | 5/2000 | Fusco et al. | 714/741 |

OTHER PUBLICATIONS

Chang, Chen, Wang and Feng, 'Waveform approximation technique in the switch–level timing', simulation BTS', 3/98, IEEE 0–7803–4455–3/98, pp. VI 326–329.*

Weng and Glesner, 'A new approach to timing driven partitioning of combinational logic', 0/91, IEEE TH 03640–0/91000/0096, pp. 96–101.*

Michael N. Misheloff: "Improved Modelling and Characterization System for Logic Stimulation", IEEE 0–7803–0768–2/92, pp. 331–334.*

Trigona R: "Library Development: An Input slope Modelling Methodology", Electronic engineering, vol. 66, No. 814, Oct. 1, 1994 pp. S55–S58.*

Schoellkopf et al., J.P. Impact of Interconnect Performances on Circuit Design, Proceedings of the IEEE 1998 International Interconnect Technology Conferences, pp. 53–55.*

Chang, D.C.Y. Multistable States MIS Transistor, Circuits, Devices and Systems, IEE Proceedings G, vol. 137, Issue 1, Feb. 1990, pp. 37–43.*

AFTAB S. A., et al. "Accurate Logic Timing Simulations by Propagating Signal Delays and Transition Times", Motorola Technical Developments, vol. 28, Aug. 1996, pp. 89–91.

Trigona R: "Library Development: An Input Slope Modelling Methodology" Electronic Engineering, vol. 66, No. 814, Oct. 1, 1994, pp. S55–S56.

Yu T: "Create Optimal Simulation Libraries Using VHDL" EDN Electrical Design News, vol. 38, No. 10, May 13, 1993, pp. 133–138, 140.

* cited by examiner

Primary Examiner—Russell Frejd
(74) Attorney, Agent, or Firm—Wolf, Greenfield & Sacks, P.C.; James H. Morris

(57) ABSTRACT

The present invention relates to a logic simulation method, in which a signal is switched between two logic states to simulate a transition of a real signal. The method comprises the step of inserting between the two logic states of the signal an intermediate state for a time interval indicative of the slope of the transition of the real signal.

32 Claims, 2 Drawing Sheets

METHOD OF ACCURATE SIMULATION OF LOGIC CIRCUITS

BACKGROUND OF THE INVENTION

1. Field of the Invention

The present invention relates to the simulation of logic circuits by means of a standardized language, such as VHDL or Verilog.

2. Discussion of the Related Art

VHDL, for example, is a high level language enabling a designer to define a complete logic circuit by a functional description. The description produced by the designer can be synthesizable or simulatable.

The synthesizable description is meant, through an appropriate software processing, to synthesize the circuit, that is, generate a definition of the elements that constitute the circuit (a netlist) which is directly exploitable by placement and routing tools for fabricating the corresponding integrated circuit.

During a synthesis step, the synthesizable description is decomposed into elementary logic functions implementable by elementary logic gates.

A simulatable description is meant to be processed by a logic simulator for generating, in particular, timing diagrams more or less accurately representing the logic evolution of the signals which will exist in a real circuit, this in order to check the proper operation of the circuit before effectively manufacturing it.

A simulatable description could include a synthesizable description only. The simulation would then provide the purely logic behavior of the circuit, which is however insufficient since the real elements of the circuit introduce signal delays which are not taken into account by a synthesizable description. These delays are likely to cause malfunctions of the real circuit whereas the pure logic behavior of the circuit is correct.

To detect these malfunctions, a simulatable description includes additional parameters to take delays into account.

A preliminary step in a simulation generally consists in converting a synthesizable description into a simulatable description by an automated processing. The synthesizable description is decomposed into elementary logic functions which are finally replaced with predefined models corresponding to elementary logic gates.

FIG. 1 schematically shows a general model of a logic gate. The model includes, in the general case, several inputs $IN_1$ to $IN_n$ and one output OUT connected to a capacitive load C. In this model, a logic table supplies the logic state of output OUT according to the logic states of the inputs (including output OUT itself for a flip-flop). Further, a description of the behavior in time defines the reaction delay of the output according to each input. More specifically, the model stores at least one delay tp per input and, if a change of state of one of inputs $IN_i$ should cause a transition on output OUT, the model generates this transition after the delay $tp_i$ associated with input $IN_i$.

The simulated signals are purely logic, that is, they only take states "0" and "1".

Hereafter, for clarity, a single-input model is considered, more specifically an inverter model. The following lines of VHDL partially represent an example of a simplified inverter model:

```
library IEEE;
use IEEE.STD_LOGIC_1164.all;
entity IV is
    generic(
        IN_fall_OUT_rise : Time : = 0.094 ns;
        IN_rise_OUT_fall : Time : = 0.087 ns;
    );
    port(
        OUT:out STD_ULOGIC;
        IN: in STD_ULOGIC
    );
end IV;
Architecture naive Of IV Is
Begin
    Process(IN)
    Variable delay : Time;
    Begin
        if(IN= '1') Then
            delay := IN_rise_out_fall
        else
            delay := IN_fall_OUT_rise;
        end if;
        OUT <= !IN After delay ;
    End
End naive;
```

The lines between "entity IV is" and "end IV" define the input IN and the output OUT of the inverter, as well as the delay parameters. There are here two delay parameters. Parameter IN_fall_OUT_rise defines the delay of a rising edge of signal OUT with respect to a falling edge of signal IN, and parameter IN_rise_OUT_fall defines the delay of a falling edge of output OUT with respect to a rising edge of input IN. Two parameters are thus available for a single input, which provides a good accuracy of the results of the simulation.

The lines between "Architecture naive Of IV Is" and "End naive" define the behavior of the inverter. Procedure "Process(IN)" is executed once for each change of state of input signal IN. Thus, as soon as signal IN changes state, it is checked whether its state is "1". If such is the case, a variable "delay" is assigned with parameter IN_rise_OUT_fall. Otherwise, variable "delay" is assigned with the second parameter IN_fall_OUT_rise. Then, output signal OUT receives the complement of input signal IN when the time contained in variable "delay" expires.

The numerical values of the parameters indicated in the above example are default values depending on the used technology. One of the problems in simulation lies in the refining of the default parameters according to the real structure of the entire circuit.

FIG. 2 illustrates the calculation of a delay in the case of an inverter. Signals $IN_R$ and $OUT_R$ correspond to the real input and output signals of the inverter. Signals $IN_S$ and $OUT_S$ are simulated signals associated with real signals $IN_R$ and $OUT_R$.

At time t0, signal $IN_R$ starts a rising transition shown, for simplicity, by a straight segment Isl. The rising transition of signal $IN_R$ causes a reaction of the inverter after a certain delay which depends on the technology used and on the slope Isl of the transition of input signal $IN_R$. Thus, real output signal $OUT_R$ only starts a falling transition at a delayed time t2. The slope Osl of this falling transition depends on the capacitive load C of the line to which the inverter output is connected, but also on slope Isl of the transition of input signal $IN_R$.

Simulated signals $IN_S$ and $OUT_S$ take only one or the other of logic states "0" and "1", and therefore cannot reflect the slopes of the transitions. Thus, it is assumed that the state of simulated input signal $IN_S$ switches from "0" to "1" at a time t1 when the rising transition of real signal $IN_R$ reaches a predetermined threshold. Similarly, it is assumed that the state of simulated output signal $OUT_S$ switches from "1" to "0" at a time t3 when the falling transition of real signal $OUT_R$ reaches a predetermined threshold. In the example shown, the switching thresholds correspond to 50% of the high logic level, for both the rising transitions and the falling transitions of the real signals. It is also usual to use a 40% threshold for rising transitions and a 60% threshold for falling transitions.

Delay tp is the duration separating the times t1 and t3 where the transitions of real signals $IN_R$ and $OUT_R$ cross the switching thresholds, that is, the duration which separates the transitions of simulated signals $IN_S$ and $OUT_S$.

As mentioned above, slope Osl of the output transition is a function of slope Isl of the input transition and of the capacitive load C to be controlled by the gate's output. As appears in FIG. 2, delay tp depends on slope Osl of the output transition and is thus also a function of slope Isl of the input transition and of load C. To summarize, tp=fd(C, Isl) and Osl=fs(C, Isl), where fd and fs are the two above-mentioned functions.

In the general case of a model with several inputs:

$$tp_i=fd_i(C, Isl_i)$$

and $$Osl_i=fs_i(C, Isl_i),$$

where index i designates the input to which the delay and slope values are associated.

Currently, to perform an accurate simulation, the layout of the final circuit is first designed, which enables a relatively accurate calculation of the capacitive loads of the various lines interconnecting the logic elements. Further, the sizes of the transistors and the technology used determine the capacitances of the inputs of the logic elements, which add to the line capacitances.

When the capacitive loads have been calculated in this manner, a so-called back-annotation of the models is performed, which consists in replacing the default delays by values calculated before the simulation from the capacitive loads found.

In the general case, the output of a first model A with several inputs is connected to an input of a second model B. The delay $tp_B$ associated with the input of model B is normally calculated from the slope of the input signal of model B, that is, from slope $Osl_i$ of the output signal of model A. Now, this output signal depends on function $fs_i$ associated with that of the inputs (i) of model A which switches.

Thus, a same input of a model may receive signals with different slopes, whereas the corresponding delay calculated in the back-annotation procedure can only take a single one of these slopes into account.

To ensure the reliability of the simulation result, the delays are calculated in the worst case situation, that is, for the smallest slopes of the input signals. This solution is not optimal since it is likely to invalidate many circuit topologies which would operate properly in reality.

FIG. 3 illustrates an example of a circuit which would be invalidated by a simulation using the conventional back-annotation procedure. This circuit includes a flip-flop 10, the output Q of which is supplied to a flip-flop 12 via a succession of gates 14 with several inputs. Flip-flops 10 and 12 are enabled by a same clock signal CK.

For such a circuit to operate properly, a transition of output Q of flip-flop 10 should be transmitted to input D of flip-flop 12 before a next transition of clock signal CK, that is, normally before the expiry of a clock period. Otherwise, the transition is lost. Thus, the sum of the delays of gates 14 must be smaller than a clock period.

In practice, the designer will attempt to limit the delays in the critical paths, that is, the paths of the type connecting the input of flip-flop 12 to the output of flip-flop 10, by reducing as much as possible the capacitive loads in these critical paths. Conversely, the lines connected to the inputs of gates 14 which are not in a critical path may, without it being impairing, have a high capacitive load, as shown by capacitors 16.

By using the conventional back-annotation procedure, the delays of gates 14 will be calculated in the worst case situation, that is, according to the slopes of the signals on the inputs outside the critical path. Thus, the whole task of the designer in optimizing the critical path is ignored during the simulation which thereby may invalidate the circuit whereas this circuit operates perfectly in reality.

The back-annotation procedure also has drawbacks in the estimation of the power consumed by the real circuit. Indeed, a CMOS circuit only consumes power during transitions, and the power consumed increases as the slope of the transitions decreases. Thus, in the worst case situation where it is assumed that all slopes are at their lowest value, the estimated power is likely to be much higher than the real power.

SUMMARY OF THE INVENTION

An object of the present invention is to provide a logic circuit simulation method which provides better accuracy in the simulation and power estimation results.

These and other objects are achieved by a method of logic simulation, in which a signal is switched between two logic states to simulate a transition of a real signal. The method includes a step of inserting between the two logic states of the signal an intermediate state during a time interval indicative of the slope of the transition of the real signal.

According to an embodiment of the present invention, a model receiving at least one input signal and providing an output signal after a delay with respect to the input signal is used. The method then includes the steps of measuring a first time interval during which the input signal is at the intermediate state and determining the delay according to this time interval, the start time of the delay, and slope information of the output signal; determining, according to the end of the delay and the output signal slope information, the start time of a transition of the output signal; and, at the beginning of the transition of the output signal, assigning to the output signal the intermediate state during a second time interval indicative of the slope of the output signal.

According to an embodiment of the present invention, the output signal slope information is the second time interval.

According to an embodiment of the present invention, the start time of the delay is considered as the point where a real transition corresponding to the input signal reaches a predetermined switching threshold between the low and high levels.

According to an embodiment of the present invention, the end of the delay is considered as the point where a real transition corresponding to the output signal reaches a predetermined switching threshold between the low and high levels.

According to an embodiment of the present invention, the first and second time intervals are equal to a predetermined fraction of the respective durations of the real transitions.

According to an embodiment of the present invention, the first and second time intervals are substantially equal to the time required for the respective real transitions to vary by a MOS transistor threshold voltage.

According to an embodiment of the present invention, the method is implemented by means of a standardized language also used for synthesizing the logic gate, the intermediate state being the standardized "don't care" state.

The foregoing objects, features and advantages of the present invention, will be discussed in detail in the following non-limiting description of specific embodiments, in connection with the accompanying drawings.

DETAILED DESCRIPTION

The present invention aims at avoiding the logic simulation inaccuracies caused by the fact that the same model input may receive signals with different real slopes. For this purpose, according to the present invention, slope information is transmitted in the simulated logic signals.

Conventionally, the simulated logic signals only take states "0" and "1". However, in a synthesis and simulation language, such as VHDL, there are other states than those normally used in synthesis alone. Among these states is the "don't care" state, designated by symbol "-" in VHDL, which is used to indicate that a gate output can indifferently be set to "1" or to "0" in certain conditions. During the circuit synthesis, this "don't care" state is replaced by a "1" or a "0", depending on a logic optimization of the circuit.

According to the present invention, slope information of a signal is formed by an intermediate state which has no logic meaning in a simulation, for example the don't care state "-", inserted between states "0" and "1" of each transition of the simulated signal. More specifically, this intermediate state is inserted during a time inversely proportional to the slope, which enables the slope to be found again by a simple measurement of the time during which the signal is at the intermediate state. The slope of each transition of an input signal is thus known, which will enable, during the simulation, an individualized calculation of the delay and the slope of the corresponding output signal. The slope of the output signal will be carried in a similar manner.

Figure 1:
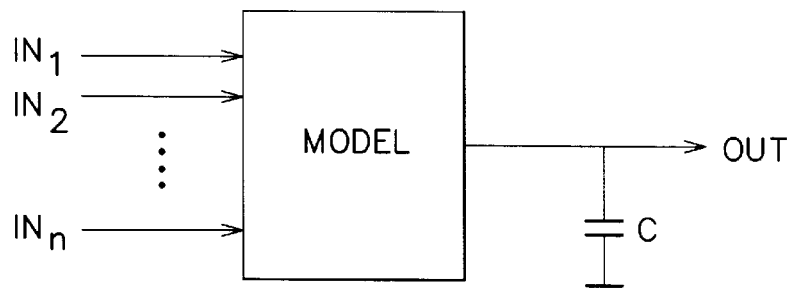
FIG. 1, previously described, shows a simulation model of a logic element with several inputs.
Figure 2:
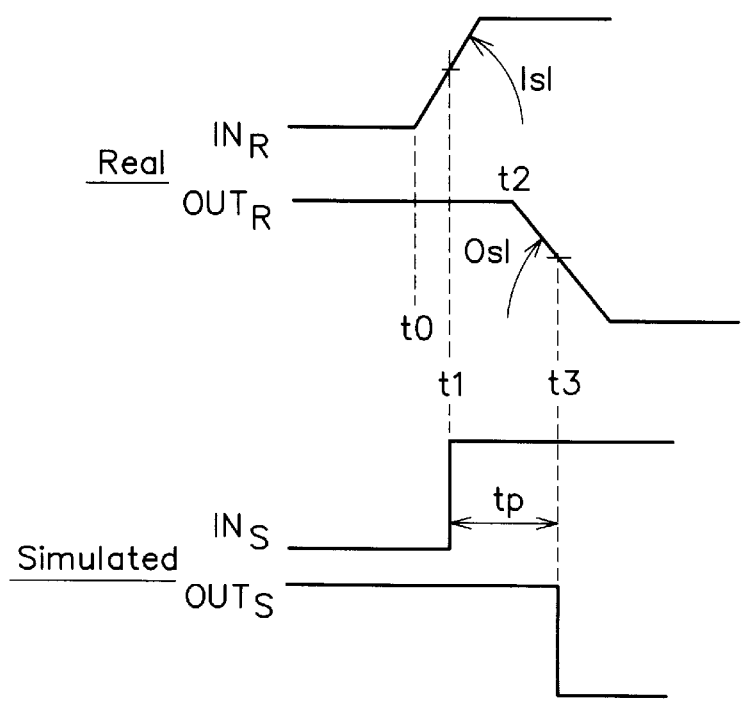
FIG. 2 shows a variation of simulated signals with respect to a variation of real signals.
Figure 3:
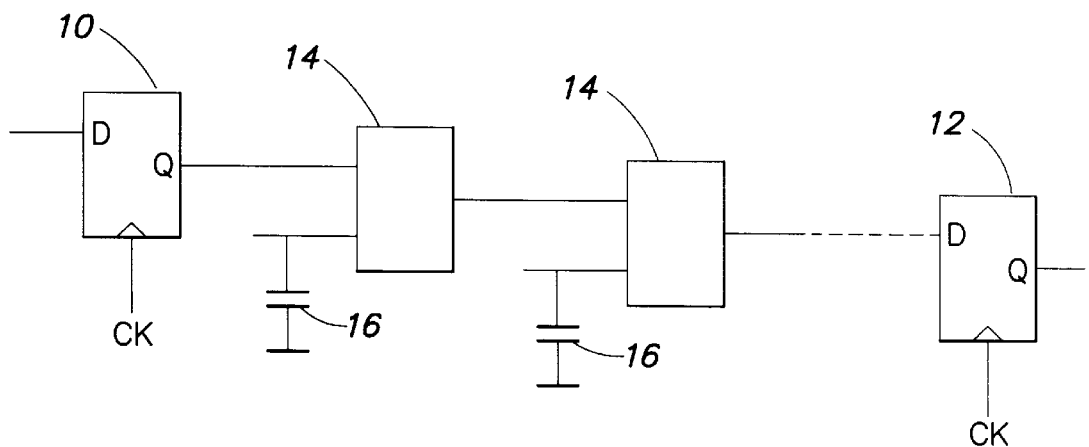
FIG. 3 partially shows a circuit which may be invalidated by a conventional simulation method while the circuit would be operative in reality.
Figure 4:
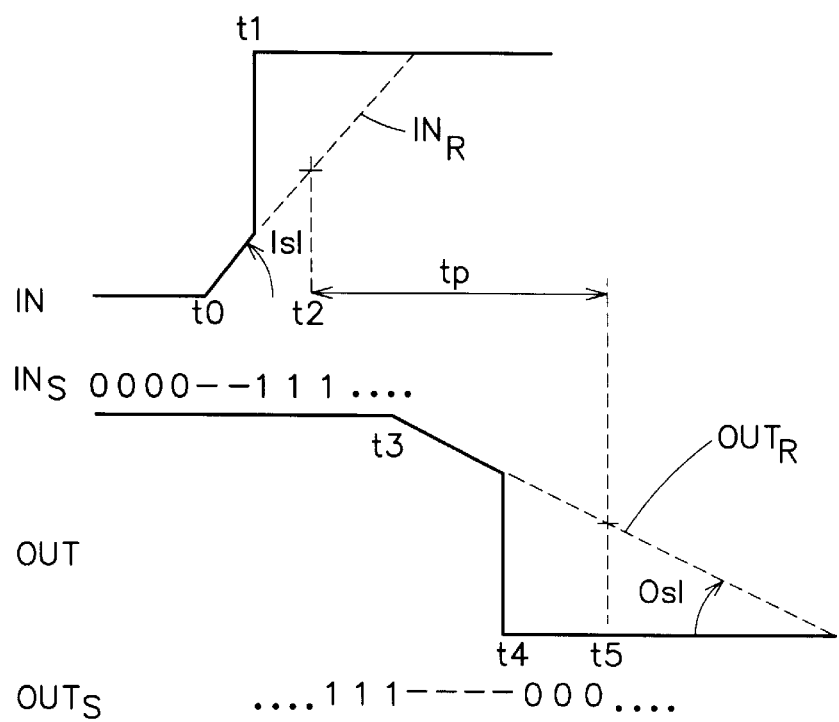
FIG. 4 illustrates a variation of simulated signals according to the present invention according to real signals.

FIG. 4 illustrates a variation example of real and simulated signals according to the present invention in the case of the simulation of an inverter. The transitions of real signals $IN_R$ and $OUT_R$ are indicated in dotted lines. Simulated signals $IN_S$ and $OUT_S$ appear in the form of samples of values "0", "1", or "-". The signals in full lines symbolize the variation of simulated signals $IN_S$ and $OUT_S$.

At time t0, corresponding to the beginning of a rising transition of real input signal $IN_R$, simulated input signal $IN_S$ switches from state "0" to state "-". The gate model is designed to detect this change of state and store time t0.

At a time t1, corresponding to the time when real input signal $IN_R$ has varied by a predetermined fraction of the high level, simulated signal $IN_S$ switches to state " 1". The gate model is designed to detect this transition, store time t1 and determine the time t1–t0 during which state "-" was provided. This duration, inversely proportional to slope Isl of the transition of real input signal $IN_R$, enables this transition to be extrapolated to find time t2 when it reaches the switching threshold (50% in this example).

Knowing input slope Isl by measuring interval t0–t1 and knowing the output capacitive load, the delay tp, which starts at time t2, can be calculated.

Time t5 when delay tp ends is then known. This time t5 corresponds to the time when the transition, here a falling transition, of real output signal $OUT_R$ crosses the switching threshold (50% in this example).

Further, slope Osl of real output signal $OUT_R$ is also calculated according to the capacitive output load and slope Isl of the input signal. Knowing the slope of the output transition and one of its points (provided by time t5), the time t3 corresponding to the beginning of the transition of real output signal $OUT_R$ can be found.

At time t3, simulated output signal $OUT_S$ switches from state "1" to state "-". The time during which signal $OUT_S$ remains at state "-" is inversely proportional to the calculated output slope, the applied proportionality coefficient being the same as that between the calculated input slope and time t1–t0. This provides time t4 at which simulated output $OUT_S$ switches from state "-" to state "0".

The measurement of duration t4–t3 by the model which receives signal $OUT_S$ as an input will enable this model to retrieve the slope and calculate according to this slope the delay and the slope of the corresponding output signal.

It is important that time t3 occurs after time t1, since time t3 is calculated from a value (t1–t0) which is only known at time t1. For this reason, the time (t1–t0, t4–t3) during which a simulated signal is at the intermediate state "-" is only a limited fraction of the duration of the corresponding transition. This fraction is chosen to ensure that time t3 always occurs after time t1, especially in cases where the delays tp are very short.

Preferably, time t1 (for the input signal) and time t4 (for the output signal) are the times when the corresponding signals have varied by a MOS transistor threshold voltage. Indeed, a logic gate can only start reacting (start a transition) at the time when a transistor which was off starts to turn on, that is, at the time when its threshold is crossed. Then, if the reaction of the gate is immediate, time t3 corresponds at least to time t1.

Preferably, the threshold used is that of N-channel MOS transistors, since it is generally lower than the threshold of P-channel transistors. In recent technologies, this choice corresponds to a variation of about 20% of the supply voltage of the logic gate.

The following VHDL lines partially represent a simplified example of an inverting gate model according to the present invention:

```
Process (IN)
Begin
    IfIN = `-' Then
        trtime := NOW;
        newOUT = !lastIN
    Else
        tIs1 := NOW - trtime;
        tp := fdelay(tIs1, Cload, SlopeParam, LoadParam);
        tOs1 := fslope(tIs1, Cload, SlopeParam, LoadParam);
        OUT <= `-' After tIs1 + tp - 2*tOs1, newOUT After tIs1 + tp - tOs1;
    end If;
    lastIN := IN;
End Process;
```

Procedure "Process(IN)" is executed once as soon as signal IN switches. It is thus executed for a first time at time t0. Input IN then being at state "-", a variable trtime receives value NOW which is current time t0, and a variable newOUT receives the complement of a variable lastIN. Variable newOUT contains the new logic state of output signal OUT and variable lastIN contains the preceding state of signal IN ("0" in FIG. 4).

Variable lastIN receives the state of signal IN at the end of each execution of procedure "Process(IN)".

At time t1, the procedure is executed again, but input IN is no longer at state "-" (it is at "1" in FIG. 4). Thus, a variable tIsl (the duration of the input transition) receives the difference between variable NOW (current time t1) and variable trtime (t0). A variable tp (the delay) receives the result of a function fdelay and a variable tOsl (the duration of the output transition) receives the result of a function fslope.

Functions fdelay and fslope use variables tIsl, Cload, SlopeParam, and LoadParam as parameters. Variable Cload is the output capacitive load. Variable SlopeParam is a slope ponderating coefficient in functions fdelay and fslope. And variable LoadParam is a ponderating coefficient of the capacitive load in functions fdelay and fslope.

Output OUT receives state "-" after waiting a time tIsl+tp−2tOsl from the beginning of the current execution of procedure "Process(IN)" (from time t1). Finally, output OUT receives the content of variable newOUT after waiting a time tIsl+tp−tOsl from time t1. The numeric values of these calculations correspond to the example shown where the times during which state "-" is provided are equal to 25% of the transition times of the real signals and where the switching thresholds are equal to 50% of the high logic level.

More or less sophisticated calculations may be used in functions fdelay and fslope, according to the desired accuracy. Of course, the more sophisticated the calculations, the longer the simulation. As an example, functions fdelay and fslope may both perform a calculation of the type SlopeParam*tIsl+LoadParam*Cload.

Parameters SlopeParam and LoadParam are chosen according to the technology used, and value Cload is obtained by a simplified back-annotation procedure merely consisting in retrieving the line capacitances.

Models according to the present invention may advantageously be used among conventional models. Indeed, a model according to the present invention which receives a signal from a conventional model will normally calculate the delay and the output slope according to the slope of the input signal which will be considered as infinite (tIsl=0). Similarly, a conventional model which receives a signal coming from a model according to the present invention will not react to intermediate state "-", since this state is the don't care state, but will react as soon as the signal switches to logic state "0" or "1".

Thus, by using models according to the present invention for critical circuit portions and conventional models for the other portions, good accuracy is obtained while decreasing the simulation time with respect to modeling only using models according to the present invention.

For sake of simplicity, the present invention has been described as an example in relation with an inverting gate, which has a single input. By means of the foregoing description, those skilled in the art will know how to modify the conventional models of gates with several inputs to make them conform to the present invention. In this case, functions fdelay and fslope are preferably individualized for each input. These functions may be individualized, either by being assigned different parameters (SlopeParam and LoadParam), or by the provision of different function bodies. Individualized functions fdelay and fslope may further be used for each transition polarity of a same input signal.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A computer-implemented logic simulation method, comprising the steps of switching a simulated signal between two logic states to simulate a transition of a real signal, and inserting between the two logic states of the simulated signal an intermediate state during a time interval indicative of a slope of a transition of the real signal, wherein said intermediate state is neither of said logic states but instead is a "don't care" state.

2. The simulation method of claim 1 for a logic gate, using a model receiving at least one input signal and providing an output signal after a delay with respect to the input signal, including the following steps:

measuring a first time interval during which the input signal is at an intermediate state and determining the delay according to this time interval, a start time of the delay, and a slope information of the output signal;

determining, according to an end of the delay and the output signal slope information, a start time of a transition of the output signal; and at the beginning of the transition of the output signal, assigning to the output signal the intermediate state during a second time interval indicative of the slope of the output signal.

3. The simulation method of claim 2, wherein the output signal slope information is the second time interval.

4. The simulation method of claim 2, wherein the start time of the delay is considered as the point where a real transition corresponding to the input signal reaches a predetermined switching threshold between the low and high levels.

5. The simulation method of claim 2, wherein the end of the delay is considered as the point where a real transition corresponding to the output signal reaches a predetermined switching threshold between the low and high levels.

6. The simulation method of claim 2, wherein the first and a second time interval are respectively equal to a predetermined fraction of the respective durations of the real transitions.

7. The simulation method of claim 6, wherein the first and second time intervals are substantially equal to the time required for the respective real transitions to vary by a MOS transistor threshold voltage.

8. The simulation method of claim 1 for a logic gate, implemented by means of a standardized language also used for synthesizing the logic gate, the intermediate state being the standardized "don't care" state.

9. A computer-implemented logic simulation method for simulating transitions of a real signal, said method comprising the steps of:

providing a simulated signal at a first logic state, inserting an intermediate state during a time interval indicative of a slope of a transition of the real signal, and then providing a simulated signal at a second logic state that is different than said first logic state, wherein said intermediate state is neither of said logic states but instead is a "don't care" state, using a model receiving at least one input signal and providing an output signal after a delay with respect to the input signal, including the following step:

measuring a first time interval during which the input signal is at the intermediate state and determining the delay according to this time interval, a start time of the delay, and slope information of the output signal.

10. The simulation method of claim 9 wherein the time interval indicative of a slope is a time inversely proportional to the slope.

11. The simulation method of claim 9, further including the step of determining, according to an end of the delay and the output signal slope information, a start time of a transition of the output signal.

12. The simulation method of claim 11 further including the step of, at the beginning of the transition of the output signal, assigning to the output signal the intermediate state during a second time interval indicative of the slope of the output signal.

13. The simulation method of claim 12, wherein the output signal slope information is the second time interval.

14. The simulation method of claim 12, wherein the start time of the delay is considered as the point where a real transition corresponding to the input signal reaches a predetermined switching threshold between the logic states.

15. The simulation method of claim 12, wherein the end of the delay is considered as the point where a real transition corresponding to the output signal reaches a predetermined switching threshold between the logic states.

16. The simulation method of claim 12, wherein a first and a second time interval are respectively equal to a predetermined fraction of the respective durations of the real transitions.

17. The simulation method of claim 16, wherein the first and second time intervals are substantially equal to the time required for the respective real transitions to vary by a MOS transistor threshold voltage.

18. The simulation method of claim 9 for a logic gate, implemented by means of a standardized language also used for synthesizing the logic gate, the intermediate state being the standardized "don't care" state.

19. computer-implemented logic simulation method, comprising the steps of: switching a signal between two logic states to simulate a transition of a real signal, and determining a slope information by an intermediate state which has no logic meaning in a simulation and is neither of said two logic states, and inserting the intermediate state between the two logic states of the signal, said intermediate state being inserted during a time that is proportional to the slope of a transition of the real signal.

20. The simulation method of claim 19, wherein the intermediate state is inserted during a time that is inversely proportional to the slope.

21. The simulation method of claim 21 determining the slope to be found by a measurement of the time during which the signal is at the intermediate state.

22. The simulation method of claim 21 further including the step of calculating the delay.

23. The simulation method of claim 22 calculating the slope corresponding output signal.

24. The simulation method of claim 19 for a logic gate, using a model receiving at least one input signal and providing an output signal after a delay with respect to the input signal, including the following steps:

measuring a first time interval during which the input signal is at an intermediate state and determining the delay according to this time interval, a start time of the delay, and a slope information of the output signal;

determining, according to an end of the delay and the output signal slope information, a start time of a transition of the output signal; and at the beginning of the transition of the output signal, assigning to the output signal the intermediate state during a second time interval indicative of the slope of the output signal.

25. The simulation method of claim 24, wherein the output signal slope information is the second time interval.

26. The simulation method of claim 24, wherein the start time of the delay is considered as the point where a real transition corresponding to the input signal reaches a predetermined switching threshold between the low and high levels.

27. The simulation method of claim 24, wherein the end of the delay is considered as the point where a real transition corresponding to the output signal reaches a predetermined switching threshold between the low and high levels.

28. The simulation method of claim 24, wherein the first and a second time interval are respectively equal to a predetermined fraction of the respective durations of the real transitions.

29. The simulation method of claim 24, wherein the first and second time intervals are substantially equal to the time required for the respective real transitions to vary by a MOS transistor threshold voltage.

30. The simulation method of claim 19 for a logic gate, implemented by means of a standardized language also used for synthesizing the logic gate, the intermediate state being the standardized "don't care" state.

31. A computer-implemented logic simulation method, comprising the steps of;
   switching a simulated signal between two logic states to simulate a transition of a real signal,
   inserting between the two logic states of this simulated signal a first intermediate state during a time interval indicative of a slope of a first transition of the real signal, and
   inserting between the two logic states of the simulated signal a second intermediate state during a time interval indicative of a slope of a second transition of the real signal,
   wherein said intermediate state is neither of said logic states but instead is a "don't care" state.

32. The simulation method of claim 31 wherein the time interval indicative of a slope is a time inversely proportional to the slope.

* * * * *

UNITED STATES PATENT AND TRADEMARK OFFICE
CERTIFICATE OF CORRECTION

PATENT NO. : 6,473,725 B1
DATED : October 29, 2002
INVENTOR(S) : Jean-Pierre Schoellkopf and Stéphane Hanriat It is certified that error appears in the above-identified patent and that said Letters Patent is hereby corrected as shown below:

Title page,
Item [73], should read:
-- [73]   Assignees:     SGS-Thomson Microelectronics S.A.
                         Gentilly (FR) --

Column 10,
Line 9, should read -- 19. A computer-implemented logic simulation method, --

Signed and Sealed this

Eighteenth Day of February, 2003

JAMES E. ROGAN
*Director of the United States Patent and Trademark Office*